United States Patent
Li et al.

(10) Patent No.: US 11,688,775 B2
(45) Date of Patent: Jun. 27, 2023

(54) METHOD OF FORMING FIRST AND SECOND CONTACTS SELF-ALIGNED TOP SOURCE/DRAIN REGION OF A VERTICAL FIELD-EFFECT TRANSISTOR

(71) Applicant: International Business Machines Corporation, Armonk, NY (US)

(72) Inventors: Juntao Li, Cohoes, NY (US); Kangguo Cheng, Schenectady, NY (US); Brent A. Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 16/101,981

(22) Filed: Aug. 13, 2018

(65) Prior Publication Data

US 2020/0052079 A1    Feb. 13, 2020

(51) Int. Cl.
*H01L 29/66* (2006.01)
*H01L 29/417* (2006.01)
*H01L 29/40* (2006.01)
*H01L 29/78* (2006.01)

(52) U.S. Cl.
CPC ...... *H01L 29/41733* (2013.01); *H01L 29/401* (2013.01); *H01L 29/66666* (2013.01); *H01L 29/7827* (2013.01)

(58) Field of Classification Search
CPC ....... H01L 21/82285; H01L 21/823487; H01L 21/823885; H01L 29/78642
See application file for complete search history.

(56) References Cited

U.S. PATENT DOCUMENTS

| | | | |
|---|---|---|---|
| 9,450,091 B2 | 9/2016 | Grivna et al. | |
| 9,466,668 B2 | 10/2016 | Colinge et al. | |
| 9,530,866 B1 * | 12/2016 | Zhang | H01L 29/0676 |
| 9,755,073 B1 | 9/2017 | Cheng et al. | |
| 9,793,401 B1 | 10/2017 | Balakrishnan et al. | |
| 9,818,875 B1 | 11/2017 | Bi et al. | |
| 9,853,127 B1 * | 12/2017 | Anderson | H01L 29/66666 |

(Continued)

OTHER PUBLICATIONS

T.J. Vink et al., "Stress, Strain, and Microstructure in Thin Tungsten Films Deposited by dc Magnetron Sputtering," Journal of Applied Physics, Jul. 15, 1993, pp. 988-995, vol. 74, No. 2.

(Continued)

*Primary Examiner* — Anh D Mai
(74) *Attorney, Agent, or Firm* — Samuel Waldbaum; Ryan, Mason & Lewis, LLP

(57) ABSTRACT

A method of forming a semiconductor structure includes forming at least one fin disposed over a top surface of a substrate, the fin providing a vertical transport channel for a vertical transport field-effect transistor. The method also includes forming a top source/drain region disposed over a top surface of the fin, and forming a first contact trench at a first end of the fin and a second contact trench at a second end of the fin, the first and second contact trenches being self-aligned to the top source/drain region. The method further includes forming inner spacers on sidewalls of the first contact trench and the second contact trench, and forming contact material in the first contact trench and the second contact trench between the inner spacers. The contact material comprises a stressor material that induces vertical strain in the fin.

19 Claims, 12 Drawing Sheets

(56) References Cited

U.S. PATENT DOCUMENTS

| | | | |
|---|---|---|---|
| 9,859,166 B1 * | 1/2018 | Cheng | H01L 21/823487 |
| 9,935,198 B2 | 4/2018 | Colinge et al. | |
| 10,461,186 B1 * | 10/2019 | Zhang | H01L 29/66666 |
| 2011/0042740 A1 * | 2/2011 | Masuoka | H01L 21/76804 257/329 |
| 2017/0194155 A1 * | 7/2017 | Anderson | H01L 21/28518 |
| 2018/0097065 A1 | 4/2018 | Zhu | |
| 2018/0337256 A1 * | 11/2018 | Anderson | H01L 29/41741 |
| 2020/0052096 A1 * | 2/2020 | Anderson | H01L 29/7827 |

OTHER PUBLICATIONS

Y.G. Shen et al., "Composition, Residual Stress, and Structural Properties of Thin Tungsten Nitride Films Deposited by Reactive Magnetron Sputtering," Journal of Applied Physics, Aug. 1, 2000, pp. 1380-1388, vol. 88, No. 3.

Windt, et al., "Variation in stress with background pressure in sputtered Mo/Si multilayer films". J. Appl. Phys., Aug. 15, 1995, vol. 78, No. 4, pp. 2423-2430.

Eneman, et al., "Scalability of Stress Induced by Contact-Etch-Stop Layers: A Simulation Study", IEEE Transactions on Electron Devices Jun. 2007, vol. 54 No. 6, pp. 1446-1453.

\* cited by examiner

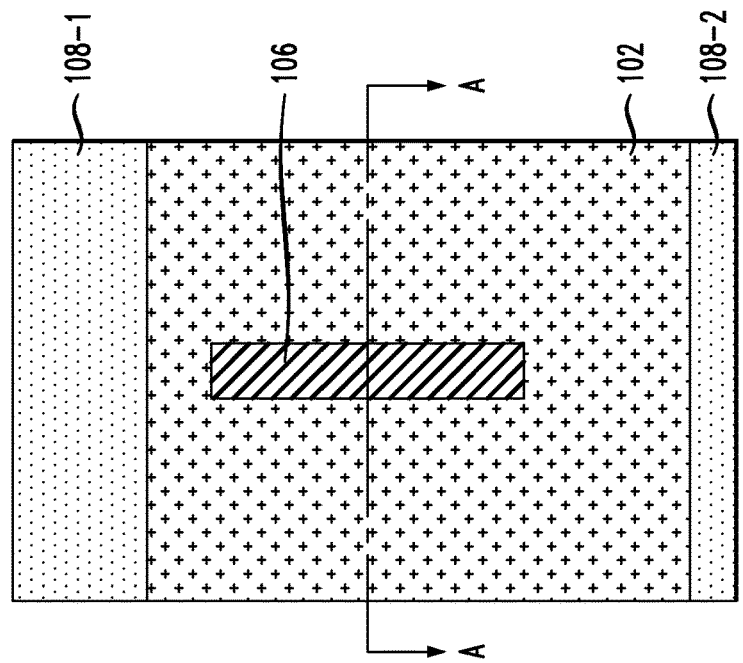

250

200

350

300

450

400

550

500

750

700

775

1100

US 11,688,775 B2

METHOD OF FORMING FIRST AND SECOND CONTACTS SELF-ALIGNED TOP SOURCE/DRAIN REGION OF A VERTICAL FIELD-EFFECT TRANSISTOR

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming vertical transport field-effect transistors with strained channels.

In one embodiment, a method of forming a semiconductor structure comprises forming at least one fin disposed over a top surface of a substrate, the at least one fin providing a vertical transport channel for a vertical transport field-effect transistor. The method also comprises forming a top source/drain region disposed over a top surface of the at least one fin, and forming a first contact trench at a first end of the at least one fin and a second contact trench at a second end of the at least one fin, the first and second contact trenches being self-aligned to the top source/drain region. The method further comprises forming inner spacers on sidewalls of the first contact trench and the second contact trench, and forming contact material in the first contact trench and the second contact trench between the inner spacers. The contact material comprises a stressor material that induces vertical strain in the at least one fin.

In another embodiment, a semiconductor structure comprises at least one fin disposed over a top surface of a substrate, the at least one fin providing a vertical transport channel for a vertical transport field-effect transistor, a top source/drain region disposed over a top surface of the at least one fin, a first contact trench disposed at a first end of the at least one fin, the first contact trench being self-aligned to the top source/drain region, a second contact trench disposed at a second end of the at least one fin, the second contact trench being self-aligned to the top source/drain region, inner spacers disposed on sidewalls of the first contact trench and the second contact trench, and contact material disposed in the first contact trench and the second contact trench between the inner spacers. The contact material comprises a stressor material that induces vertical strain in the at least one fin.

In another embodiment, an integrated circuit comprises a vertical transport field-effect transistor comprising at least one fin disposed over a top surface of a substrate, the at least one fin providing a vertical transport channel for the vertical transport field-effect transistor, a top source/drain region disposed over a top surface of the at least one fin, a first contact trench disposed at a first end of the at least one fin, the first contact trench being self-aligned to the top source/drain region, a second contact trench disposed at a second end of the at least one fin, the second contact trench being self-aligned to the top source/drain region, inner spacers disposed on sidewalls of the first contact trench and the second contact trench, and contact material disposed in the first contact trench and the second contact trench between the inner spacers. The contact material comprises a stressor material that induces vertical strain in the at least one fin.

BRIEF DESCRIPTION OF THE DRAWINGS

FIG. 1A depicts a cross-sectional view of a fin disposed over a substrate, according to an embodiment of the invention.

FIG. 1B depicts a top-down view of the FIG. 1A structure, according to an embodiment of the invention.

FIG. 6A depicts a cross-sectional view of the FIG. 5A structure following formation of a top source/drain region, according to an embodiment of the invention.

FIG. 6B depicts a top-down view of the FIG. 6A structure, according to an embodiment of the invention.

DETAILED DESCRIPTION

Figure 2B:
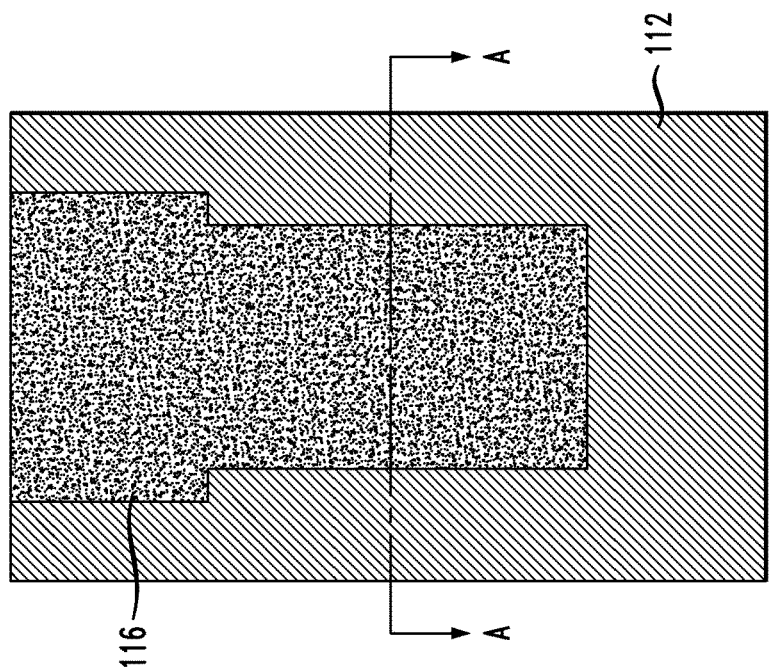
FIG. 2B depicts a top-down view of the FIG. 2A structure, according to an embodiment of the invention.

Illustrative embodiments of the invention may be described herein in the context of illustrative methods for forming vertical field-effect transistors with strained channels, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of majority carriers along a channel that runs past the gate between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques. An important indicator of device performance is carrier mobility. It is difficult to keep carrier mobility high as devices continue to shrink in size.

Current carrying capability, and thus performance of a FET, may be considered proportional to the mobility of a majority carrier in the channel. The mobility of holes (e.g., the majority carriers in a pFET) and the mobility of electrons (e.g., the majority carriers in an nFET) can be enhanced by applying an appropriate stress to the channel. Stress engineering methods may be used to enhance performance, increasing device drive current without increasing device size or capacitance. Application of a tensile stress to nFETs enhances electron mobility, while application of compressive stress to pFETs enhances hole mobility.

Vertical transport FETs (VTFETs) are considered as viable CMOS architectures for scaling to 5 nanometers (nm) node and beyond. Strain engineering is highly desired for enhancing the drive current of VTFETs. Unlike conventional horizontal transistors, it is difficult to introduce strain in the vertical direction in VTFETs due to the free top surface. A vertically standing semiconductor fin (e.g., providing a vertical transport channel for a VTFET) will become relaxed regardless of its initial strain status due to the free top surface. Therefore, there is a need for techniques for forming strained VTFETs that preserve strain in the entire fabrication process.

Illustrative embodiments provide techniques for forming VTFETs with strained channels. In some embodiments, fin cut processes are performed during patterning of openings for bottom source/drain and gate contacts. An inner spacer is applied to protect exposed fin sidewalls and the top source/drain region after such patterning of the openings for the bottom source/drain and gate contacts. Highly stressed films are then filled into the openings, where the highly stressed films function as both metal contacts and stressor material. The stress-containing material is filled as close as possible to the vertical fin channels to improve the proximity of the stressor to the channel. The fin length in VTFETs may range, such as between 40 and 60 nanometers (nm), which can enhance the stress coupling efficiency by a ratio between the stress level in the stress material and the stress transferred to the channel for mobility enhancement.

In some embodiments, a processing flow for forming VTFETs with strained channels includes forming fins, a bottom spacer, a gate stack (e.g., a gate dielectric such as a high-k dielectric followed by a gate conductor such as a work function metal (WFM) material), a top spacer and a top source/drain region. An interlevel dielectric (ILD) is filled and then patterned to form openings for contacts to the bottom source/drain region and the gate conductor, where the openings are formed as close as possible to the fin channel (e.g., self-aligned to the top source/drain region disposed over the fin providing the vertical transport channel for the VTFET). To form the opening for the contact to the bottom source/drain region, the bottom spacer is etched to expose the bottom source/drain region. An inner spacer (e.g., a nitride spacer) is then formed on sidewalls of the openings of the ILD to seal the exposed fin ends. The ILD is then further patterned to form an opening for the contact to the top source/drain region. Contact material is then filled in the openings to form the bottom source/drain contact, the top source/drain contact and the gate contact. The contact material may then be planarized. In some embodiments, the ILD may then be removed and re-filled to improve stress transfer efficiency.

The resulting VTFET structure includes a bottom source/drain, a vertical fin channel, a bottom spacer next to the vertical fin on top of the bottom source/drain region, a gate stack (e.g., a gate dielectric such as a high-k dielectric and a gate conductor such as a WFM material) surrounding the vertical fin, a top source/drain region on top of the vertical fin, and a top spacer between the top source/drain and the gate stack. Contact material (e.g., high stress metal material) is self-aligned with the top source/drain region to form contacts to the bottom source/drain region and the gate conductor of the gate stack. An inner spacer is formed before the contact material, so as to insulate the contact material from the top source/drain region.

In VTFETs formed using such techniques, the bottom source/drain contact and the gate contact serve as both metal conductors and as stressor material. Thus, tensile or compressive stress can be introduced into the fin channel along the vertical direction. Because the bottom and top source/drain regions have already been placed, the stress can be effectively transferred into the fin channels, thus providing VTFETs with high carrier mobility.

Illustrative processes for forming VTFETs with strained channels will now be described with respect to FIGS. 1-11.

FIG. 1A depicts a cross-sectional view 100 of a structure including a substrate 102, a fin 104 disposed over a top surface of the substrate 102, and a hard mask (HM) 106 disposed over a top surface of the fin 104. FIG. 1B depicts a top-down view 150 of the structure shown in FIG. 1A. The top-down view 150 illustrates formation of shallow trench isolation (STI) regions 108-1, 108-2. The cross-sectional view 100 of FIG. 1A is taken across the fin along the line A-A shown in the top-down view 150.

The substrate 102 may comprise a semiconductor substrate formed of silicon (Si), although other suitable materials may be used. For example, the substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, silicon germanium (SiGe), carbon-doped silicon germanium carbide (SiGe:C), carbon-doped silicon (Si:C), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc.

The substrate 102 may have a vertical thickness or height (in direction Y-Y') ranging from 0.5 millimeters (mm) to 1.5 mm. The substrate 102 may have a horizontal thickness or width (in direction X-X') and a length (in direction Z-Z') selected as desired for a particular application, such as based on a desired number of fins or resulting VTFETs or other features to be formed thereon. It should be appreciated that while FIGS. 1-11 are described with respect to forming a single VTFET using fin 104, multiple VTFETs may be formed using multiple fins formed over the substrate 102. The fin 104 may be formed using lithography followed by etching (e.g., reactive-ion etching (RIE)). Other suitable techniques, such as sidewall image transfer (SIT), self-aligned double patterning (SADP), self-aligned multiple patterning (SAMP), self-aligned quadruple patterning (SAQP) can be used. The fin 104 may be formed of the same material as the substrate 102. For example, both the fin 104 and the substrate 102 may be formed of silicon (Si). Alternatively, the fin 104 may be formed of different material from the substrate 102 by first epitaxially growing a different material on the substrate 102, and then perform patterning to form the fin 104. For example, the fin 104 can be silicon germanium (SiGe) while the substrate 102 can be Si. The fin may have a vertical thickness or height (in direction Y-Y') ranging from 30 nm to 100 nm, a horizontal thickness or width (in direction X-X') ranging from 4 nm to 12 nm, and a length (in direction Z-Z') ranging from 20 nm to 100 nm. It should be noted that the dimensions of the fin 104 (as well as the dimensions of other features and layers described here) may vary as desired for a particular application, and are not limited to the specific ranges of dimensions. Thus, fins with other dimensions are also conceived.

The HM 106 may be initially formed over a top surface of the entire substrate, followed by patterning using SIT or other suitable techniques, with the fins 104 being formed by etching portions of the substrate 102 exposed by the patterned HM 106 to arrive at the structure shown in FIG. 1A. The HM 106 may be formed of silicon nitride (SiN), although other suitable materials such as silicon oxide ($SiO_x$), silicon dioxide ($SiO_2$) and silicon oxynitride (SiON) may be used. The HM 106 can have a single material (e.g., SiN) or multiple materials (e.g., SiN on top of SiOx). The HM 106 may have a horizontal thickness or width (in direction X-X') and a length (in direction Z-Z') that matches that of the underlying fin 104. The HM 106 may have a vertical thickness or height (in direction Y-Y') in the range of 20 nm to 50 nm.

The isolation regions 108 (e.g., shallow trench isolation (STI)), also referred to herein as STI regions 108, may be formed of a dielectric material such as silicon oxide ($SiO_x$), silicon nitride (SiN), silicon oxycarbide (SiOC), silicon oxynitride (SiON), or any other suitable dielectric materials. In some embodiments, the isolation regions 108 can be formed of multiple materials, for example, SiN on STI trench sidewalls and $SiO_x$ filling the rest of the STI trench. The isolation regions 108 may have a vertical thickness or height (in direction Y-Y') in the range of 40 nm to 100 nm. The height of the STI regions 108 is shown more clearly in the cross-sectional views of FIGS. 7C and 8-11, described in further detail below. As shown in FIG. 1B, a first end of the fin 104 is spaced from the STI region 108-1. Alternatively, a first end of the fin 104 abuts the STI region 108-1. The second end of the fin 104 is spaced apart from the STI region 108-2, so as to leave space for forming a bottom source/drain contact as will be described in further detail below with respect to FIGS. 8-11.

Figure 2A:
FIG. 2A depicts a cross-sectional view of the FIG. 1A structure following formation of a bottom source/drain region, bottom spacer and gate stack, according to an embodiment of the invention.

FIG. 2A shows a cross-sectional view 200 of the FIG. 1 structure following formation of a bottom source/drain region 110, a bottom spacer 112, a gate dielectric 114, and a gate conductor 116. FIG. 2B shows a top-down view 250 of the FIG. 2A structure. The cross-sectional view 200 of FIG. 2A is taken along the line A-A shown in the top-down view 250.

The bottom source/drain region 110 may comprise a portion of the substrate 102 that is suitable doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). The bottom source/drain region 110 may be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration in the source/drain can range from $1 \times 10^{19}$ $cm^{-3}$ to $3 \times 10^{21}$ $cm^{-3}$, or preferably between $2 \times 10^{20}$ $cm^{-3}$ to $3 \times 10^{21}$ $cm^{-3}$.

The bottom source/drain region 110 may have a height or vertical thickness (in direction Y-Y') in the range of 20 nm to 60 nm.

The bottom spacer 112 is formed over the bottom source/drain region 110, such as using non-conformal deposition and etch-back processing (e.g., physical vapor deposition (PVD), high density plasma (HDP) deposition, etc.). The bottom spacer 112 may be formed of $SiO_2$, SiN, silicon carbide oxide (SiCO), silicon boron carbide nitride (SiBCN), etc., although other suitable materials may be used. The bottom spacer 112 may have a height or vertical thickness (in direction Y-Y') in the range of 5 nm to 8 nm.

The gate dielectric layer 114, together with the gate conductor layer 116, provides the gate stack for the resulting VTFET. The gate (including gate dielectric 114 and gate conductor layer 116) can be formed by deposition followed by patterning techniques (e.g., lithography followed by etching). The gate dielectric layer 114 can comprise any suitable dielectric material, including but not limited to silicon oxide (SiO$_x$), silicon nitride (SiN), silicon oxynitride (SiON), high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric 114 has a thickness ranging from 1 nm to 5 nm, although less thickness and greater thickness are also conceived.

The gate conductor layer 116 may be formed of any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. titanium aluminide (Ti$_3$Al), zirconium aluminide (ZrAl)), tantalum carbide (TaC), tantalum magnesium carbide (TaMgC), carbon nanotube, conductive carbon, graphene, or any suitable combination of these materials. The conductive material may further comprise dopants that are incorporated during or after deposition.

In some embodiments, the gate may further comprise a work function setting layer between the gate dielectric and gate conductor. The work function setting layer can be a work function metal (WFM). The WFM can be any suitable material, including but not limited IQ a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor 116 and work function setting layer or WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc. The gate conductor layer 116 may have a uniform thickness in the range of 5 nm to 15 nm.

Figure 3B:
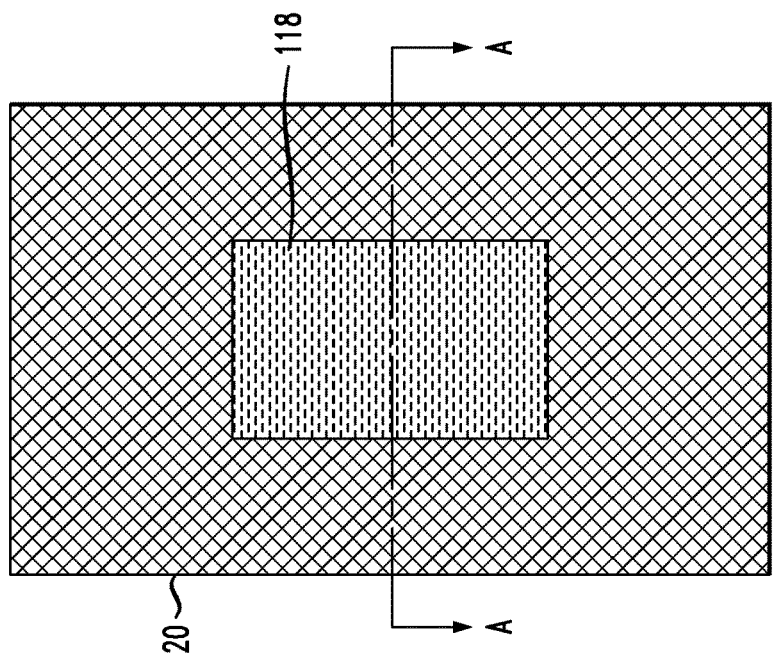
FIG. 3B depicts a top-down view of the FIG. 3A structure, according to an embodiment of the invention.
Figure 3A:
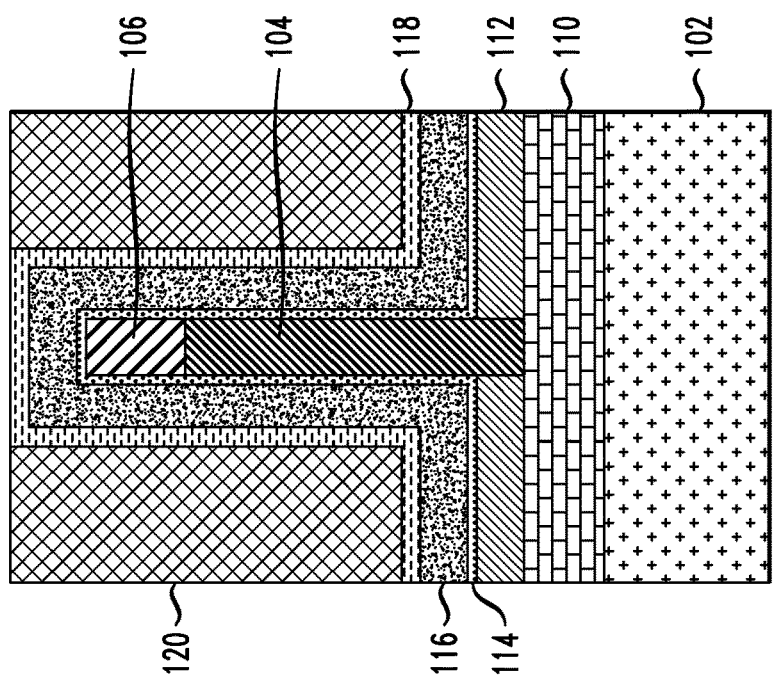
FIG. 3A depicts a cross-sectional view of the FIG. 2A structure following formation of an interlevel dielectric, according to an embodiment of the invention.

FIG. 3A shows a cross-sectional view 300 of the FIG. 2 structure following formation of a liner 118 and ILD 120. FIG. 3B shows a top-down view 350 of the FIG. 3A structure. The cross-sectional view 300 of FIG. 3A is taken along the line A-A in the top-down view 350.

The liner layer 118 may comprise a nitride such as SiN, or another suitable material such as silicon boron carbon nitride (SiBCN). The liner layer 118 may be formed using chemical vapor deposition (CVD) processing. The liner layer 118 may have a uniform thickness in the range of 4 nm to 8 nm.

The ILD 120 may comprise an oxide such as flowable oxide, or another suitable material such as carbon doped oxide, fluorine doped oxide, etc. The ILD 120 may be formed using an oxide fill process, followed by planarization using chemical mechanical polishing (CMP) or another suitable technique, stopping on the top surface of the liner layer 118 formed over the gate stack on top of the HM 106.

Figures 4A, 4B:
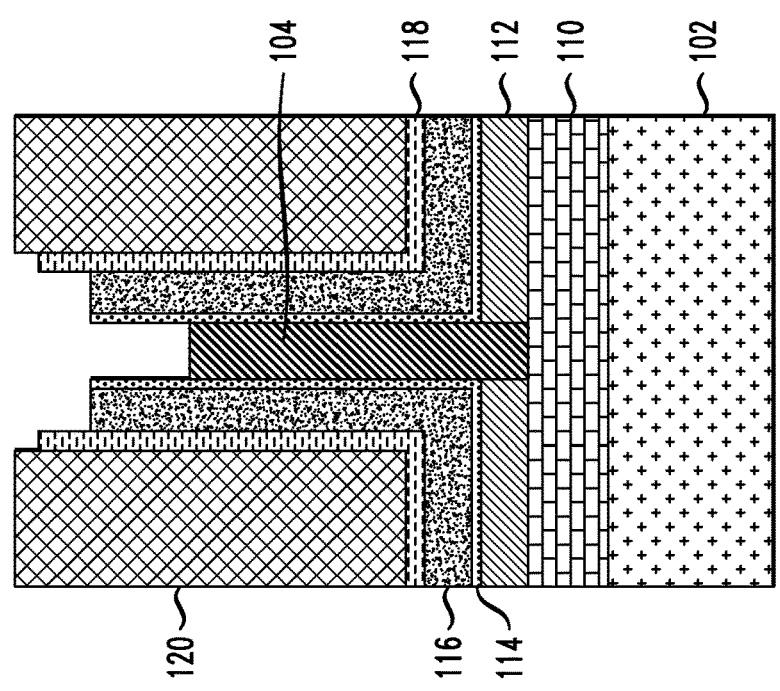
FIG. 4A depicts a cross-sectional view of the FIG. 3A structure following removal of portions of a liner, the gate stack and a hard mask disposed over a top surface of the fin, according to an embodiment of the invention.
FIG. 4B depicts a top-down view of the FIG. 4A structure, according to an embodiment of the invention.

FIG. 4A shows a cross-sectional view 400 of the FIG. 3 structure following removal of portions of the liner layer 118, the gate stack and the HM 106. FIG. 4B shows a top-down view 450 of the FIG. 4A structure. The cross-sectional view 400 of FIG. 4A is taken along the line A-A in the top-down view 450.

A portion of the liner layer 118 may be removed as illustrated, using wet etch or dry etch such as plasma etching. Portions of the gate stack (e.g., the gate conductor layer 116 and gate dielectric layer 114) are then removed or recessed using wet and/or dry etch processing. The HM 106 disposed over the fin 104 is then removed using wet etch and/or dry etch.

Figure 5B:
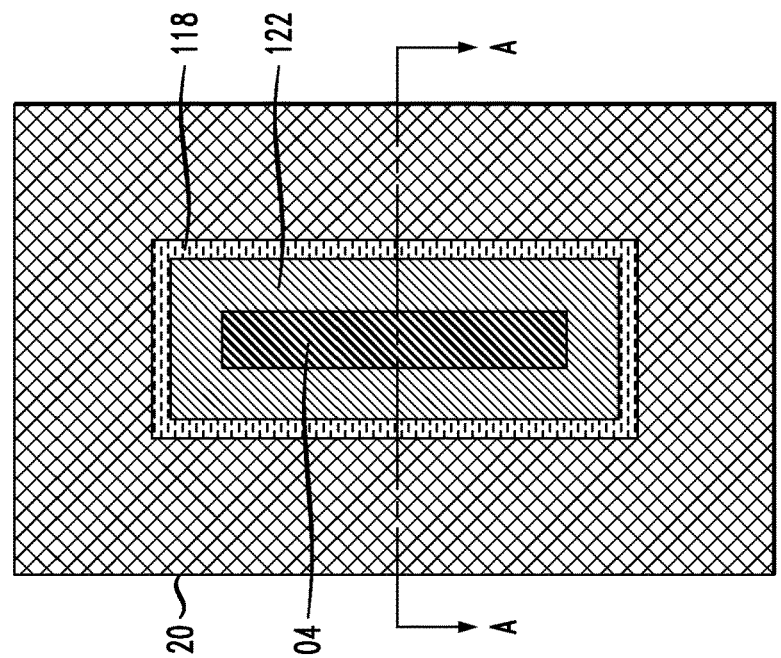
FIG. 5B depicts a top-down view of the FIG. 5A structure, according to an embodiment of the invention.
Figure 5A:
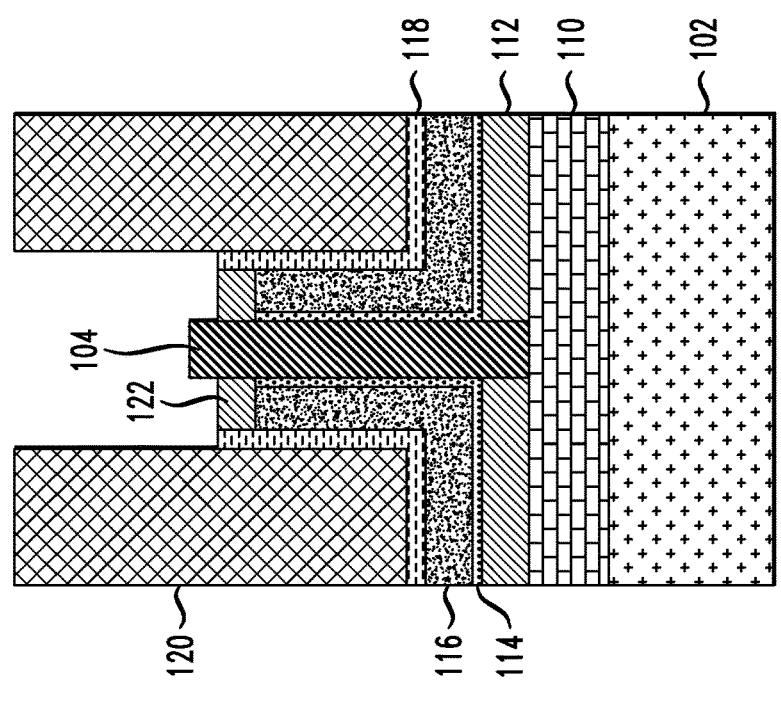
FIG. 5A depicts a cross-sectional view of the FIG. 4A structure following formation of divots between the fin and the liner, and following divot fill to form top spacers, according to an embodiment of the invention.

FIG. 5A shows a cross-sectional view 500 of the FIG. 4 structure following formation of divots between the fin 104 and the liner layer 118, and following divot fill to form top spacers 122 in the divots. FIG. 5B shows a top-down view 550 of the FIG. 5A structure. The cross-sectional view 500 of FIG. 5A is taken along the line A-A in the top-down view 550.

To create the divots, the gate stack (e.g., gate conductor 116 and gate dielectric 114) is chamfered using an isotropic etch, creating "divots" between the fin 104 and the surrounding liner layer 118. The horizontal thickness or width of each of the divots (in direction X-X) is equivalent to the thickness of the gate stack. The vertical thickness or height of each of the divots (in direction Y-Y') is in the range of 8 nm to 20 nm.

The isotropic etch of the gate stack may also remove portions of the liner layer 118 as illustrated. A divot fill process is then used to form the top spacer 122 by a conformal deposition and etch-back process which pinches off the gaps between the fin 104 and the liner layer 118. The top spacer 122 may be formed of similar or different dielectric materials as that of the bottom spacer 112.

FIG. 6A shows a cross-sectional view 600 of the FIG. 5 structure following formation of a top source/drain region 124. FIG. 6B shows a top-down view 650 of the FIG. 6A structure. The cross-sectional view 600 of FIG. 6A is taken along the line A-A in the top-down view 650.

The top source/drain region 124 may be formed using an epitaxial growth process, similar to that described above with respect to formation of the bottom source/drain region 110. The top source/drain region 124, at its widest (in direction X-X'), may have a horizontal width or thickness in the range of 15 nm to 30 nm filling the opening in the ILD 120. The top source/drain region 124, at its tallest (in direction Y-Y'), may have a vertical height or thickness in the range of 15 nm to 50 nm. The top source/drain region 124, at its longest (in direction Z-Z'), may have a length in the range of 20 nm to 100 nm. The length of the top source/drain region 124 is illustrated in FIGS. 7C and 8-11, described in further detail below.

Figure 7B:
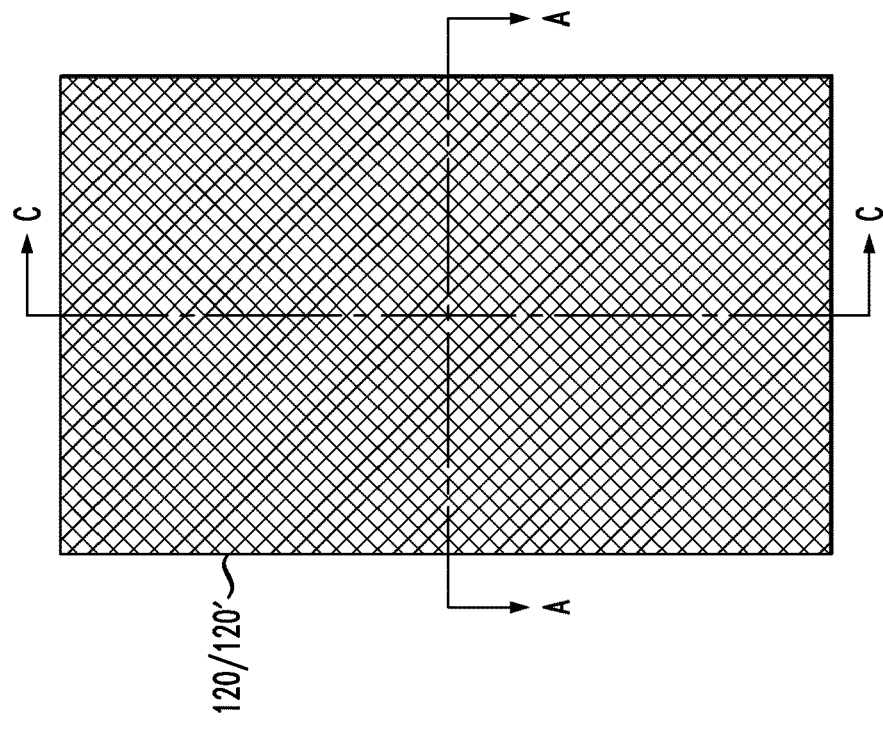
FIG. 7B depicts a top-down view of the FIG. 7A structure, according to an embodiment of the invention.
Figure 7A:
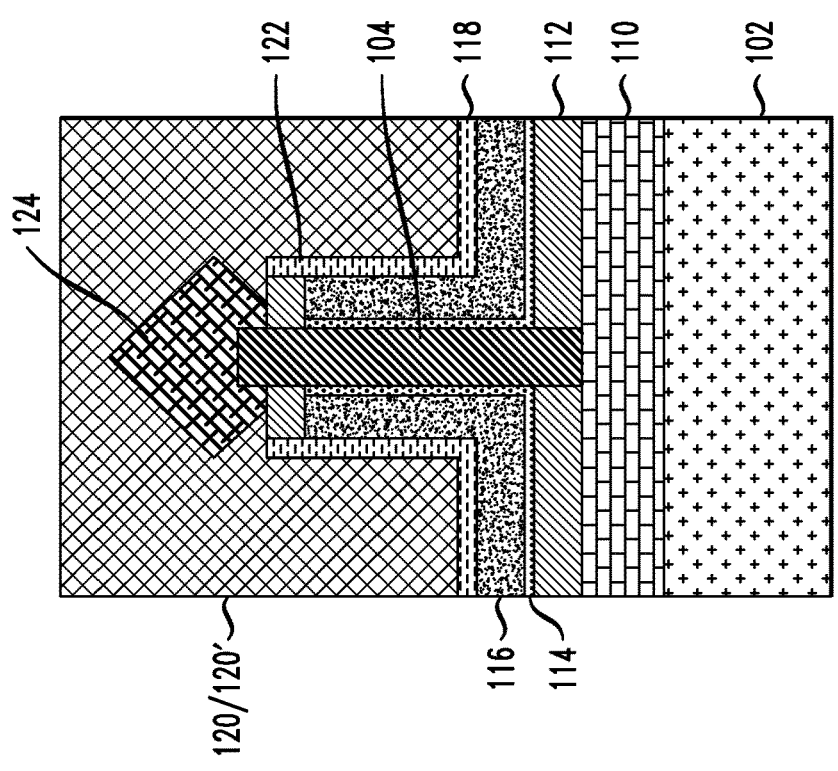
FIG. 7A depicts a first cross-sectional view of the FIG. 6A structure taken across the fin following formation of an interlevel dielectric, according to an embodiment of the invention.
Figure 7C:
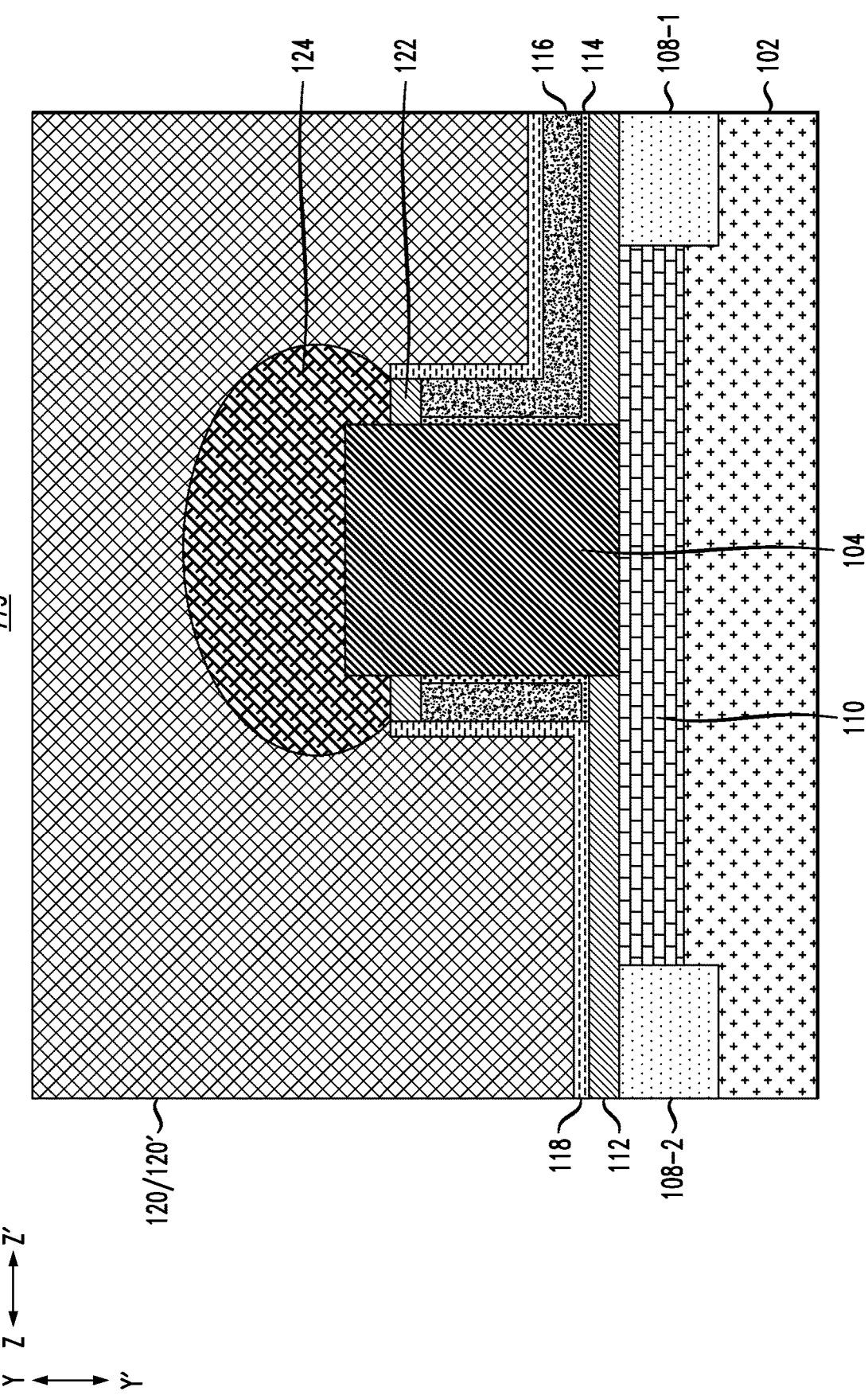
FIG. 7C depicts a second cross-sectional view of the FIG. 6A structure taken along the fin following formation of the interlevel dielectric, according to an embodiment of the invention.

FIG. 7A shows a first cross-sectional view 700 of the FIG. 6 structure following formation of additional ILD 120'. FIG. 7B shows a top-down view 750 of the FIG. 7A structure. FIG. 7C shows a second cross-sectional view 775 of the FIG. 6A structure. The first cross-sectional view 700 of FIG. 7A is taken along the line A-A in the top-down view 750 (e.g., across or perpendicular to the fin 104). The second cross-sectional view 775 of FIG. 7C is taken along the line C-C in the top-down view 750 (e.g., along or parallel to the fin 104).

The additional ILD 120' may be filled over the FIG. 6A structure, and then planarized using CMP or another suitable process. The additional ILD 120' may, in some embodiments, be formed of a same material as ILD 120, although this is not a requirement. The combined ILD 120/120' may have a vertical height or thickness (in direction Y-Y'), at its tallest, in the range of 20 nm to 60 nm.

Figure 8:
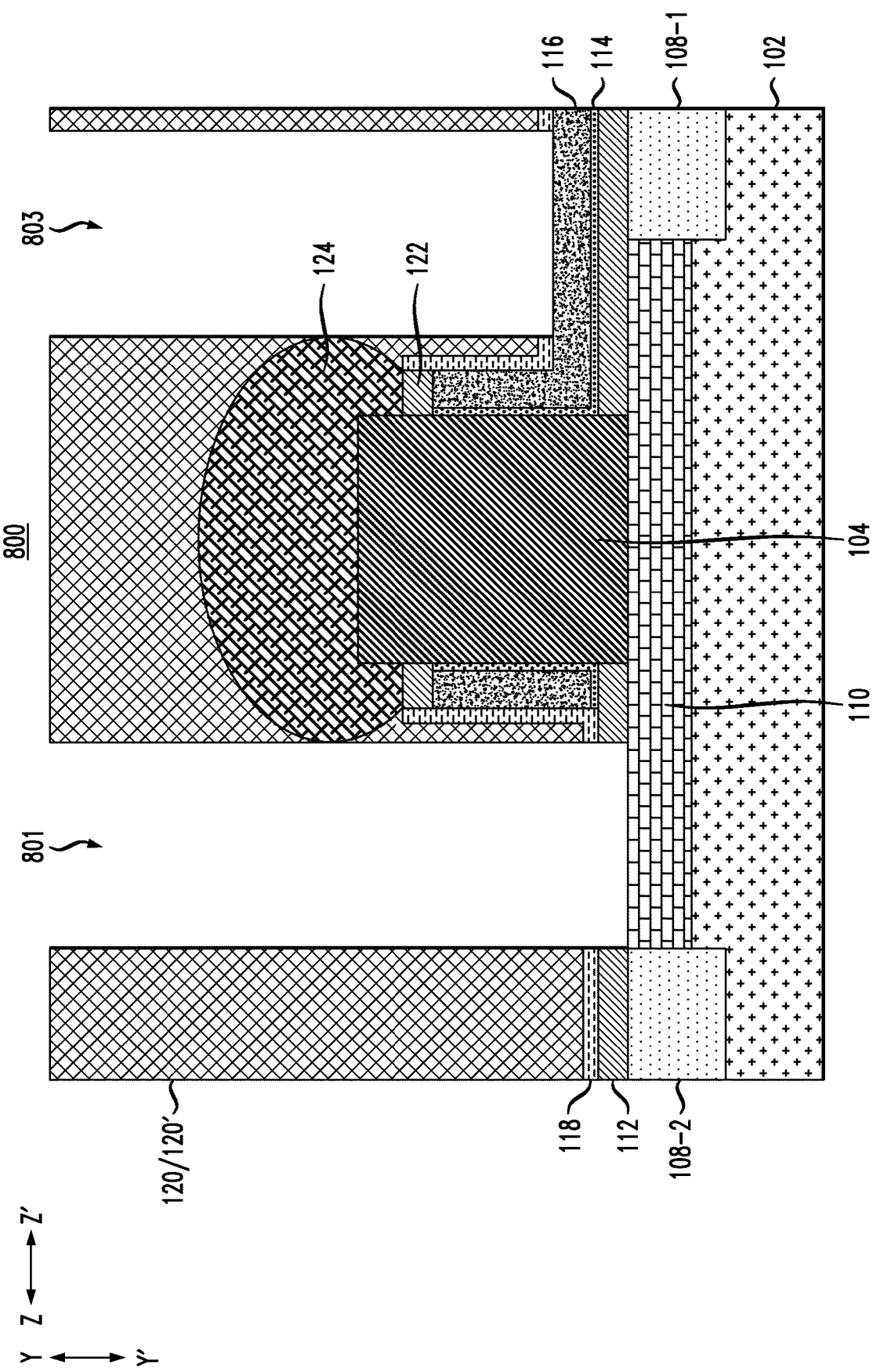
FIG. 8 depicts a cross-sectional view of the FIG. 7C structure following formation of contact trenches, according to an embodiment of the invention.

FIG. 8 shows a cross-sectional view 800 of the FIG. 7 structure following formation of contact trenches 801 and 803. The cross-sectional view 800 of FIG. 8, as well as the cross-sectional views of FIGS. 9-11, are all taken along or parallel to the fin 104 similar to the second cross-sectional view 775 of FIG. 7C.

The contact trenches 801 and 803 may be used for formation of contacts to the bottom source/drain region 110 and gate conductor 116, respectively. Each of the contact trenches 801 and 803 may be etched separately. The bottom source/drain region 110 is exposed by the contact trench 801, and the gate conductor 116 is exposed by the contact trench 803. The etch processes used to form contact trenches 801 and 803 may comprise directional RIE processes that are self-aligned to the top source/drain region 124. By forming the contact trenches 801 and 803 very close Q the edges of the top source/drain region 124, the stressor material filled in the contact trenches 801 and 803 is advantageously in close proximity to the vertical transport channel (e.g., fin 104) of the resulting VTFET.

Figure 9:
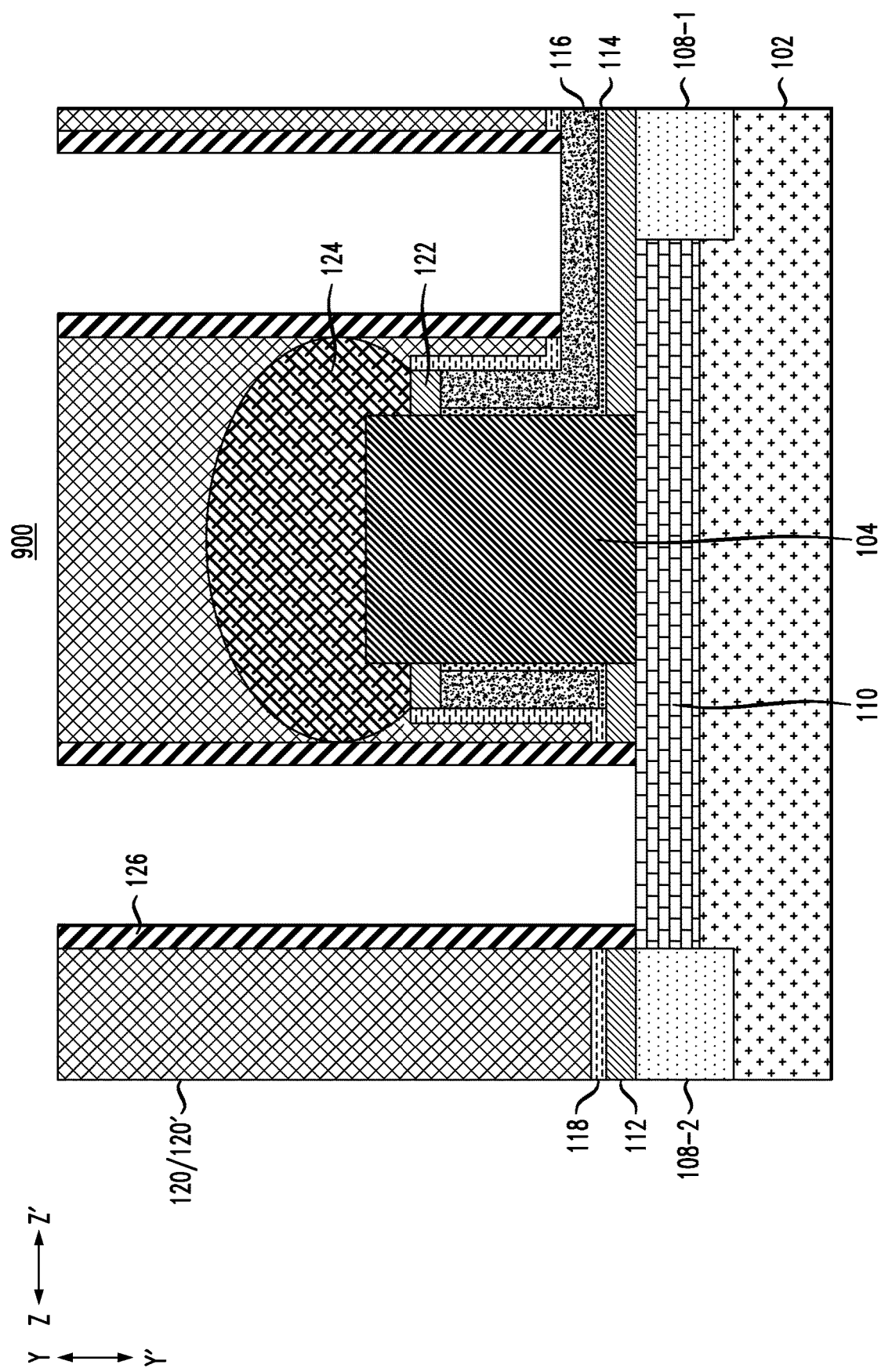
FIG. 9 depicts a cross-sectional view of the FIG. 8 structure following formation of inner spacers, according to an embodiment of the invention.

FIG. 9 shows a cross-sectional view 900 of the FIG. 8 structure following formation of inner spacers 126 on sidewalls of the contact trenches 801 and 803. The inner spacers 126 may be formed of any suitable dielectric materials. Some examples of the spacer material suitable for use as inner spacers 126 include, but are not limited to, silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), silicon oxide, and combinations thereof. The inner spacers 126 may have a uniform thickness in the range of 4 nm to 8 nm. The inner spacers 126 isolate the top source/drain region 124 from the contact material that is filled in the contact trenches 801 and 803.

Figure 10:
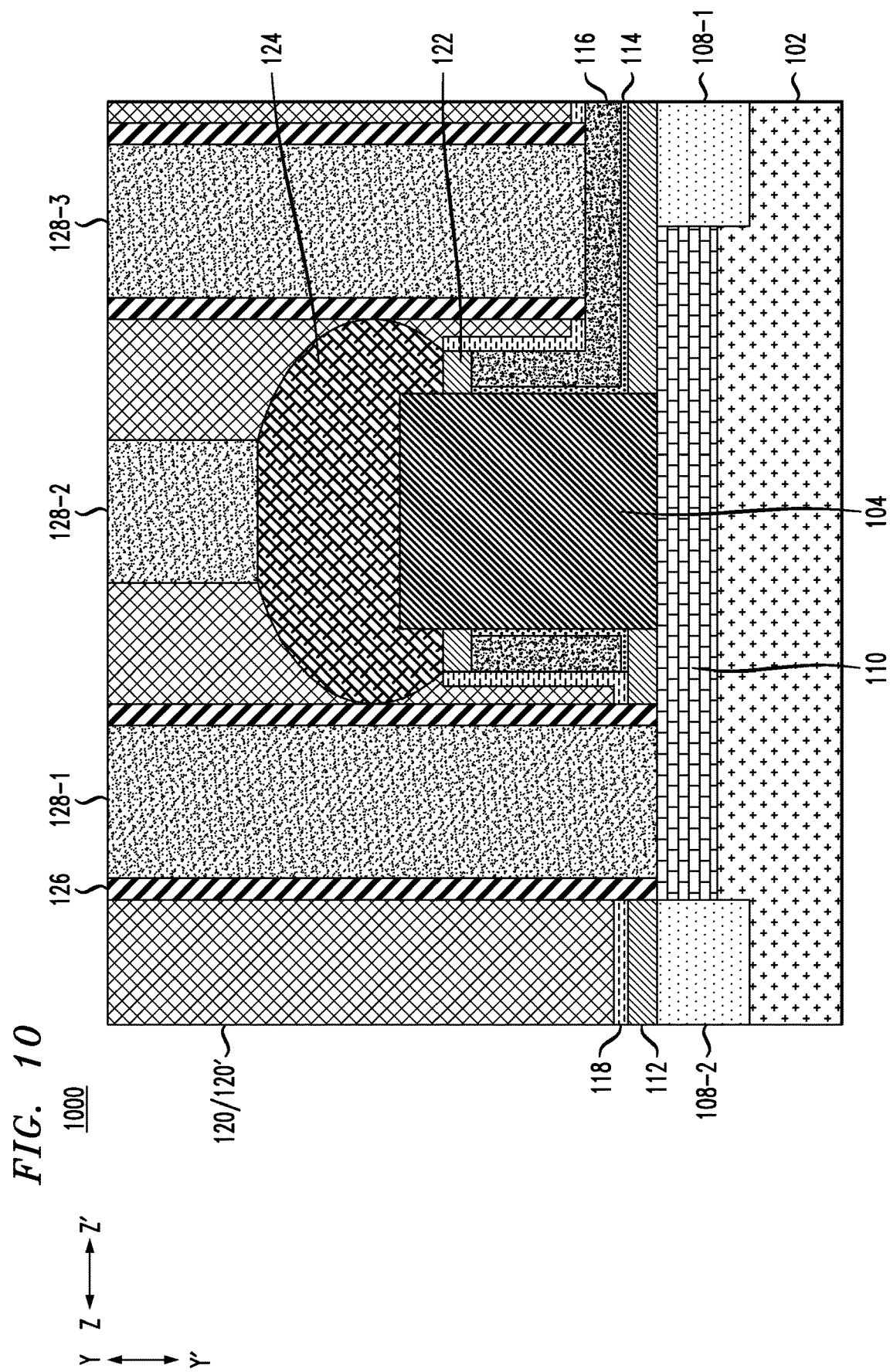
FIG. 10 depicts a cross-sectional view of the FIG. 9 structure following formation of contacts, according to an embodiment of the invention.
Figure 11:
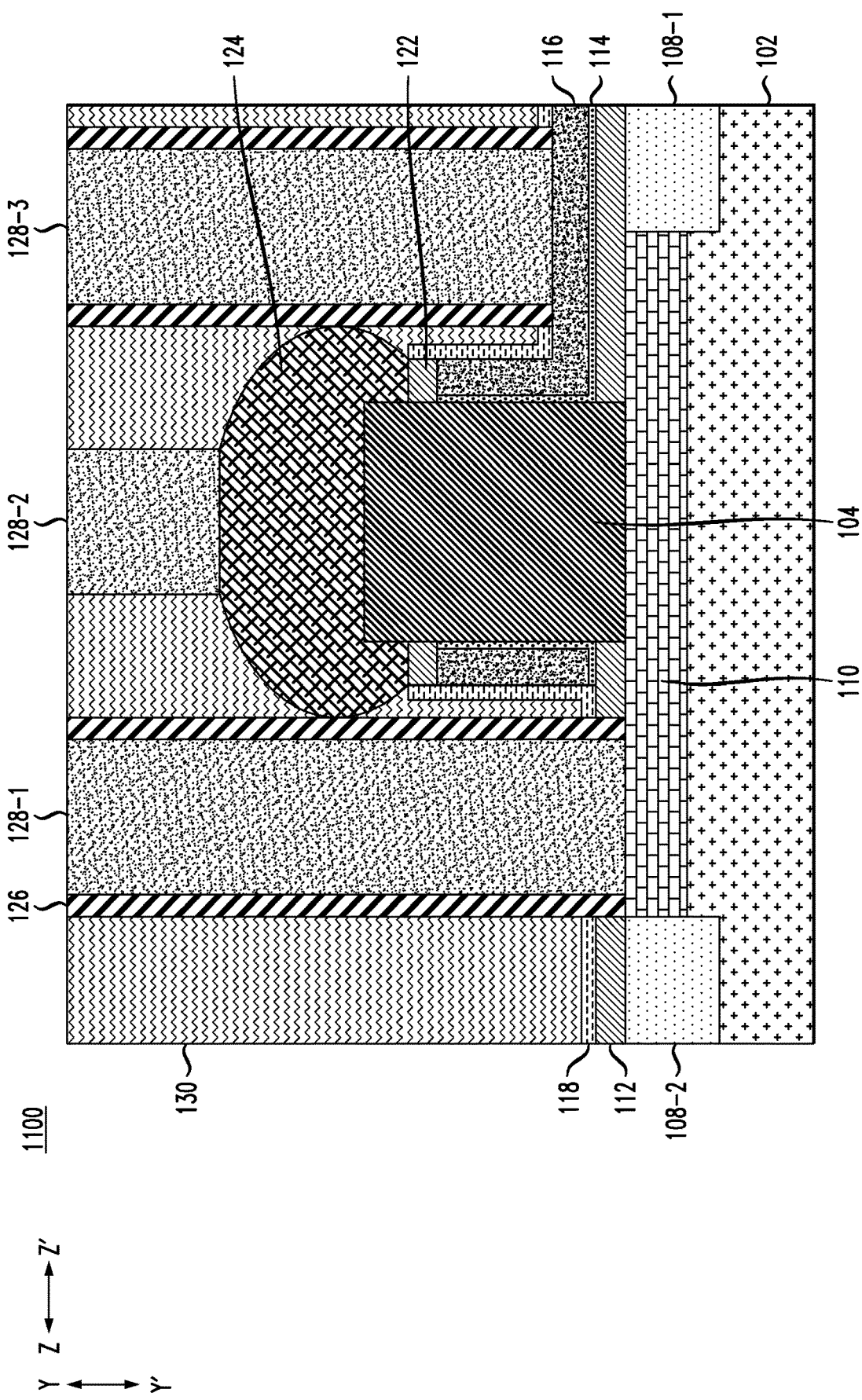
FIG. 11 depicts a cross-sectional view of the FIG. 10 structure following removal and re-filling of the interlevel dielectric, according to an embodiment of the invention.

FIG. 10 shows a cross-sectional view 1000 of the FIG. 9 structure following formation of contacts 128-1, 128-2 and 128-3 (collectively, contacts 128). The contact 128-1 is a bottom source/drain contact formed in the contact trench 801. The contact 128-2 is a top source/drain contact formed in an additional contact trench formed after the processing described above with respect to FIG. 9. The top source/drain contact 128-2 does not require the inner spacers 126, and thus may be formed in a contact trench that is opened in the ILD 120/120' after formation of the inner spacers 126. The contact 128-3 is a gate contact formed in the contact trench 803.

The material of the contacts 128 may comprise a highly stressed material that is deposited in the respective contact trenches. The contacts 128 may comprise tungsten (W) or another suitable highly stressed material such as tungsten nitride (WN), copper (Cu), cobalt (Co), nickel (Ni), titanium (Ti). In some embodiments, a barrier layer is deposited on the sidewalls of the contact trenches before filling the rest of the contact trenches with contact metal. The barrier layer can be titanium nitride (TiN), tantalum nitride (TaN), hafnium nitride (HfN), niobium nitride (NbN), tungsten nitride (WN), tungsten carbon nitride (WCN), or combinations thereof. In various embodiments, the barrier layer can be deposited in the trench(es) by ALD, CVD, MOCVD, PECVD, or combinations thereof. In various embodiments, the metal fill can be formed by ALD, CVD, and/or PVD to form the electrical contacts 128. The highly stressed contact material will compress the fin 104, thus introducing strain into the vertical transport channel of the VTFET. In some embodiments, the top source/drain contact 128-2 may further contribute to channel strain for the VTFET.

Deposition conditions used to form the highly stressed contact material may be tuned to achieve a desired level and type of channel strain. As described above, the contact trenches 801 and 803 for contacts 128-1 and 128-3 are formed as close as possible to the top source/drain region 124 (and thus as close as possible to the fin 104). The inner spacers 126 prevent shorting of the contacts 128-1 and 128-3 to the top source/drain region 124. For different types of VTFETs, it is desired to induce different types of strain in the fin 104. For nFETs, tensile vertical strain is desired. For pFETs, compressive vertical strain is desired. By tuning the deposition conditions, different polarities may be achieved for forming the highly stressed contact material to provide the desired type of vertical channels strain (e.g., tensile or compressive).

Various techniques may be used to obtain different stress in tungsten by tuning the deposition conditions. Tungsten deposited by a magnetron sputtering process can have an intrinsic compressive stress up to 3 GigaPascals (GPa) with argon (Ar) pressure less than 0.5 Pascals (Pa) during the tungsten deposition. The compressive stress metal contact produces compressive strain in the fin 104 along its length (in direction Z-Z'), and tensile strain along the vertical fin channel direction (in direction Y-Y'). When the Ar pressure is around 2.0 Pa, tensile tungsten can be obtained. The tensile stress metal contact produces tensile strain in the fin 104 along its length (in direction Z-Z'), and compressive strain along the vertical fin channel direction (in direction Y-Y'). The stress in a tungsten nitride film can also be tuned by tuning the concentration of nitrogen in the tungsten nitride film. Combinations of these and other techniques for varying the strain in the contact material may be used in other embodiments.

FIG. 11 shows a cross-sectional view 1100 of the FIG. 10 structure, following removal of the ILD 120/120' and re-fill with ILD 130 to improve stress transfer efficiency by achieving a desired strain balance from the highly stressed contacts 128-1 and 128-3 to the fin 104. The ILD 120/120' may be removed using any suitable ILD etch process such as wet etch (e.g., hydrogen fluoride acid) or dry etch (e.g., plasma etch) processing. The ILD 130 may be filled using CVD or spin-on processing. In some embodiments, the ILD 130 may be formed of the same material as the ILD 120/120'. In other embodiments, the ILD 130 may be formed of a different material than the ILD 120/120'. The ILD 130 material, for example, may be silicon oxide, carbon doped silicon oxide, fluorine doped silicon oxide, boron carbon nitride, hydrogen silsesquioxane polymer (HSQ), methyl silsesquioxane polymer (MSQ), methyl doped silica or $SiO_x(CH_3)_y$ or $SiC_xO_yH_y$, organosilicate glass (SiCOH), and porous SiCOH, and mixtures thereof.

It should be noted that, by removing the original ILD 120 and replacing it with ILD 130, multiple device benefits are achieved at the same time. First, by removing the ILD 120, strain transfer from the stress metal contact to the fin channel is enhanced. The enhanced strain in fin channel improves the carrier mobility and thus the drive current of the VTFET. Second, the ILD 130 can be ultra-low-k dielectric material (k stands for the relative dielectric constant) such as a porous dielectric (e.g., porous SiCOH) with a k value less than 3.0. The lower tie dielectric constant of the ILD 130 is, the lower tie parasitic capacitance among the contacts and the VTFET. Lowering parasitic capacitance is beneficial to device performance because it reduces the power consumption of the device and improves the speed of the circuits.

In some embodiments, a method of forming a semiconductor structure comprises forming at least one fin disposed over a top surface of a substrate, the at least one fin providing a vertical transport channel for a VTFET. The method also comprises forming a top source/drain region disposed over a top surface of the at least one fin, and forming a first contact trench at a first end of the at least one fin and a second contact trench at a second end of the at least one fin, the first and second contact trenches being self-aligned to the top source/drain region. The method further comprises forming inner spacers on sidewalls of the first contact trench and the second contact trench, and forming contact material in the first contact trench and the second contact trench between the inner spacers. The contact material comprises a stressor material that induces vertical strain in the at least one fin.

The first contact trench may provide an opening that reveals a portion of a top surface of a bottom source/drain region at the first end of the at least one fin, the second contact trench may provide an opening that reveals a portion of a gate conductor of a gate stack surrounding the at least one fin at the second end of the at least one fin, and the first contact trench abuts a portion of the top source/drain region at the first end of the at least one fin and the second contact trench abuts a portion of the top source/drain region at the second end of the at least one fin.

Forming the contact material may comprise selecting a designated set of deposition conditions for forming the stressor material to induce a desired type of vertical strain in the at least one fin. The VTFET may comprise a p-type VTFET, and forming the contact material may comprise depositing the stressor material with a first polarity inducing compressive vertical strain in the at least one fin. The VTFET may comprise an n-type VTFET, and forming the contact material may comprise depositing the stressor material with a second polarity inducing a tensile vertical strain in the at least one fin.

The method may further comprise, subsequent to forming the contact material in the first contact trench and the second contact trench between the inner spacers, removing an interlevel dielectric disposed between the inner spacers and the at least one fin, and filling an additional interlevel dielectric disposed between the inner spacers and the at least one fin to increase stress transfer from the stressor material to the at least one fin.

The method may further comprise forming a hard mask disposed over the at least one fin, forming shallow trench isolation regions disposed in the top surface of the substrate at the first and second ends of the at least one fin, forming a bottom source/drain region in the top surface of the substrate between the shallow trench isolation regions, forming a bottom spacer disposed over a top surface of the bottom source/drain region surrounding a portion of sidewalls of the at least one fin, forming a gate dielectric layer disposed over a top surface of the bottom spacer, surrounding exposed sidewalls of the at least one fin, and disposed over the hard mask, forming a gate conductor layer disposed over the gate dielectric layer, forming a liner layer disposed over the gate conductor layer, forming a first interlevel dielectric layer over the liner layer, planarizing the first interlevel dielectric layer to expose a top surface of the liner layer disposed over the at least one fin, removing a portion of the liner layer exposed by the first interlevel dielectric layer, removing portions of the gate conductor layer and the gate dielectric layer to reveal a top surface of the hard mask, removing the hard mask to expose the top surface of the at least one fin, performing an isotropic etch that removes portions of the liner layer, the gate conductor layer and the gate dielectric layer to create divots between the at least one fin and a remaining portion of the liner layer, forming a top spacer in the divots between the at least one fin and the remaining portion of the liner layer, forming the top source/drain region over the top surface of the at least one fin, forming a second interlevel dielectric layer over the top source/drain region, planarizing the second interlevel dielectric layer, forming the first contact trench by patterning a first opening in the first and second interlevel dielectric layers utilizing directional reactive-ion etching to reveal a portion of the top surface of the bottom source/drain region at the first end of the at least one fin, forming the second contact trench by patterning a second opening the first and second interlevel dielectric layers utilizing directional reactive-ion etching to reveal a portion of the gate conductor layer at the second end of the at least one fin, forming the inner spacers on sidewalls of the first contact trench and the second contact trench, forming a third contact trench by patterning a third opening in the first and second interlevel dielectric layers utilizing directional reactive-ion etching to reveal a portion of the top surface of the top source/drain region, and forming the contact material by depositing the stressor material in the first, second and third contact trenches. The method may further comprise removing the first and second interlevel dielectric layers, and forming a third interlevel dielectric layer to increase stress transfer from the stressor material to the at least one fin.

In some embodiments, a semiconductor structure comprises at least one fin disposed over a top surface of a substrate, the at least one fin providing a vertical transport channel for a VTFET, a top source/drain region disposed over a top surface of the at least one fin, a first contact trench disposed at a first end of the at least one fin, the first contact trench being self-aligned to the top source/drain region, a second contact trench disposed at a second end of the at least one fin, the second contact trench being self-aligned to the top source/drain region, inner spacers disposed on sidewalls of the first contact trench and the second contact trench, and contact material disposed in the first contact trench and the second contact trench between the inner spacers. The contact material comprises a stressor material that induces vertical strain in the at least one fin.

The first contact trench may provide an opening to a portion of a top surface of a bottom source/drain region at the first end of the at least one fin, the second contact trench may provide an opening to a portion of a gate conductor of a gate stack surrounding the at least one fin at the second end of the at least one fin, the first contact trench may abut a portion of the top source/drain region at the first end of the at least one fin, and the second contact trench may abut a portion of the top source/drain region at the second end of the at least one fin.

The VTFET may comprise a p-type VTFET, and the stressor material may have a first polarity inducing compressive vertical strain in the at least one fin.

The VTFET may comprise an n-type VTFET, and the stressor material may have a second polarity inducing a tensile vertical strain in the at least one fin.

In some embodiments, an integrated circuit comprises a vertical transport field-effect transistor comprising at least one fin disposed over a top surface of a substrate, the at least one fin providing a vertical transport channel for the vertical transport field-effect transistor, a top source/drain region disposed over a top surface of the at least one fin, a first contact trench disposed at a first end of the at least one fin, the first contact trench being self-aligned to the top source/drain region, a second contact trench disposed at a second end of the at least one fin, the second contact trench being self-aligned to the top source/drain region, inner spacers disposed on sidewalls of the first contact trench and the second contact trench, and contact material disposed in the first contact trench and the second contact trench between the inner spacers. The contact material comprises a stressor material that induces vertical strain in the at least one fin.

The first contact trench may provide an opening to a portion of a top surface of a bottom source/drain region at the first end of the at least one fin, the second contact trench may provide an opening to a portion of a gate conductor of a gate stack surrounding the at least one fin at the second end of the at least one fin, the first contact trench may abut a portion of the top source/drain region at the first end of the at least one fin, and the second contact trench may abut a portion of the top source/drain region at the second end of the at least one fin.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
    forming at least one fin disposed over a top surface of a substrate, the at least one fin providing a vertical transport channel for a vertical transport field-effect transistor;
    forming a top source/drain region disposed over a top surface of the at least one fin;
    forming an interlevel dielectric layer surrounding the top source/drain region and the at least one fin;
    forming a first contact trench in the interlevel dielectric layer at a first end of the at least one fin for a bottom source/drain contact of the vertical transport field-effect transistor and a second contact trench in the interlevel dielectric layer at a second end of the at least one fin for a gate contact of the vertical transport field-effect transistor, the first and second contact trenches being self-aligned to the top source/drain region, the first contact trench abutting a portion of the top source/drain region at the first end of the at least one fin and the second contact trench abutting a portion of the top source/drain region at the second end of the at least one fin;
    forming inner spacers on sidewalls of the first contact trench and the second contact trench; and
    forming contact material in the first contact trench and the second contact trench between the inner spacers;
    wherein the contact material comprises a stressor material that induces vertical strain in the at least one fin.

2. The method of claim 1, wherein:
    the first contact trench provides an opening that reveals a portion of a top surface of a bottom source/drain region at the first end of the at least one fin; and
    the second contact trench provides an opening that reveals a portion of a gate conductor of a gate stack surrounding the at least one fin at the second end of the at least one fin.

3. The method of claim 1, wherein forming the contact material comprises selecting a designated set of pressure deposition conditions for forming the stressor material to induce a desired type of vertical strain in the at least one fin.

4. The method of claim 1, wherein the vertical transport field-effect transistor (VTFET) comprises a p-type VTFET, and wherein forming the contact material comprises depositing the stressor material with a first polarity inducing compressive vertical strain in the at least one fin.

5. The method of claim 1, wherein the vertical transport field-effect transistor (VTFET) comprises an n-type VTFET, and wherein forming the contact material comprises depositing the stressor material with a second polarity inducing a tensile vertical strain in the at least one fin.

6. The method of claim 1, further comprising:
forming a hard mask disposed over the at least one fin;
forming shallow trench isolation regions disposed in the top surface of the substrate at the first and second ends of the at least one fin;
forming a bottom source/drain region in the top surface of the substrate between the shallow trench isolation regions;
forming a bottom spacer disposed over a top surface of the bottom source/drain region surrounding a portion of sidewalls of the at least one fin;
forming a gate dielectric layer disposed over a top surface of the bottom spacer, surrounding exposed sidewalls of the at least one fin, and disposed over the hard mask; and
forming a gate conductor layer disposed over the gate dielectric layer.

7. The method of claim 6, further comprising:
forming a liner layer disposed over the gate conductor layer;
forming a first portion of the interlevel dielectric layer over the liner layer; and
planarizing the first portion of the interlevel dielectric layer to expose a top surface of the liner layer disposed over the at least one fin.

8. The method of claim 7, further comprising:
removing a portion of the liner layer exposed by the first portion of the interlevel dielectric layer;
removing portions of the gate conductor layer and the gate dielectric layer to reveal a top surface of the hard mask; and
removing the hard mask to expose the top surface of the at least one fin.

9. The method of claim 8, further comprising:
performing an isotropic etch that removes portions of the liner layer, the gate conductor layer and the gate dielectric layer to create divots between the at least one fin and a remaining portion of the liner layer; and
forming a top spacer in the divots between the at least one fin and the remaining portion of the liner layer.

10. The method of claim 9, further comprising:
forming the top source/drain region over the top surface of the at least one fin;
forming a second portion of the interlevel dielectric layer over the top source/drain region; and
planarizing the second portion of the interlevel dielectric layer.

11. The method of claim 10, further comprising:
forming the first contact trench by patterning a first opening in the first and second portions of the interlevel dielectric layer utilizing directional reactive-ion etching to reveal a portion of the top surface of the bottom source/drain region at the first end of the at least one fin;
forming the second contact trench by patterning a second opening in the first and second portions of the interlevel dielectric layer utilizing directional reactive-ion etching to reveal a portion of the gate conductor layer at the second end of the at least one fin; and
forming the inner spacers on sidewalls of the first contact trench and the second contact trench.

12. The method of claim 11, further comprising:
forming a third contact trench by patterning a third opening in the first and second portions of the interlevel dielectric layer utilizing directional reactive-ion etching to reveal a portion of the top surface of the top source/drain region; and
forming the contact material by depositing the stressor material in the first, second and third contact trenches.

13. The method of claim 12, further comprising:
removing the first and second portions of the interlevel dielectric layer; and
forming an additional interlevel dielectric layer to increase stress transfer from the stressor material to the at least one fin.

14. The method of claim 3 wherein forming the contact material comprises utilizing a magnetron sputtering process with an intrinsic compressive stress.

15. The method of claim 3 wherein the contact material comprises tungsten, and wherein forming the contact material comprises depositing tungsten utilizing a magnetron sputtering process with a value for a pressure of argon selected to produce one of a compressive strain and a tensile strain in the at least one fin in a vertical fin direction.

16. The method of claim 15 wherein the value of the pressure of argon is selected to be less than 0.5 Pascals (Pa) to produce tensile strain in the at least one fin in the vertical fin direction.

17. The method of claim 15 wherein the value of the pressure of argon is selected to be approximately 2.0 Pascals (Pa) to produce compressive strain in the at least one fin in the vertical fin direction.

18. The method of claim 3 wherein the contact material comprises tungsten nitride, and wherein forming the contact material comprises tuning a concentration of nitrogen during deposition of the tungsten nitride to induce the desired type of vertical strain in the at least one fin.

19. The method of claim 3 wherein selecting the designated set of pressure deposition conditions for forming the stressor material to induce the desired type of vertical strain in the at least one fin comprises:
selecting a pressure of argon to be utilized in a magnetron sputtering process for forming the contact material; and
selecting a concentration of nitrogen utilized in the magnetron sputtering process for forming the contact material.

* * * * *